United States Patent [19]
Veenstra

[11] Patent Number: 5,144,232
[45] Date of Patent: Sep. 1, 1992

[54] TESTING DEVICE FOR AN ELECTRIC GENERATOR

[76] Inventor: Larry W. Veenstra, 2325 S. Holly Place, Denver, Colo. 80222

[21] Appl. No.: 692,949

[22] Filed: Apr. 29, 1991

[51] Int. Cl.⁵ .................. G01P 3/46; G01R 31/02
[52] U.S. Cl. ................... 324/177; 324/157; 324/158 MG
[58] Field of Search .......... 324/158 R, 158 MG, 177, 324/158 SM, 158 SY, 166; 322/99; 340/648; 290/40 A, 40 D; 361/30

[56] References Cited

U.S. PATENT DOCUMENTS

| | | | |
|---|---|---|---|
| 4,222,005 | 9/1980 | Naito | 324/158 MG |
| 4,670,698 | 6/1987 | Fulton et al. | 324/158 MG X |
| 4,816,756 | 3/1989 | Fox | 324/158 MG X |
| 4,829,234 | 5/1989 | Gretsch | 324/158 MG |

FOREIGN PATENT DOCUMENTS

| | | | |
|---|---|---|---|
| 0193761 | 9/1986 | European Pat. Off. | 324/177 |
| 648909 | 2/1979 | U.S.S.R. | 324/177 |

*Primary Examiner*—Kenneth A. Wieder
*Assistant Examiner*—Warren S. Edmonds
*Attorney, Agent, or Firm*—Leon Gilden

[57] ABSTRACT

An RPM and voltage indicator is used to check the operating speed and voltage output of a generator set. The device is used to verify the proper operation of a generator set or any auxiliary power unit, such as a DC to AC invertor, and further functions as a tool to make necessary adjustments to a governor or frequency control of any such generator set or auxiliary power unit.

1 Claim, 3 Drawing Sheets

TESTING DEVICE FOR AN ELECTRIC GENERATOR

BACKGROUND OF THE INVENTION

1. Field of the Invention

The present invention relates to generator testing instruments, and more particularly pertains to an RPM and voltage indicator for an electric generator.

2. Description of the Prior Art

The use of RPM and voltage test instruments for various types of equipment is known in the prior art. A typical example of such a testing instrument is to be found in U.S. Pat. No. 4,222,005, which issued to Shotaro Naito on Sep. 9, 1980 and which is directed to a testing device for generator output voltage regulators. This typical prior art testing instrument utilizes a variable voltage generator for supplying a variable voltage to the input of the voltage regulator, a DC power source, and a resistor connected between the DC power source and the field coil, whereby presence or absence of failures of the voltage regulator may be judged from a magnitude of the input variable voltage and a change in voltage at a junction between the field coil and the resistor as the input voltage is gradually increased. While being functional for its intended purpose, this type of testing instrument is not representative of a device which utilizes current state of the art technology and is accordingly less reliable in operation. As such, it can be appreciated that there exists a continuing need for new and improved testing instruments which can be utilized to test the RPM and voltage associated with an electric generator or some auxiliary power unit. In this regard, the present invention substantially fulfills this need.

SUMMARY OF THE INVENTION

In view of the foregoing disadvantages inherent in the known types of testing instruments now present in the prior art, the present invention provides an improved RPM and voltage testing instrument construction wherein the same can be utilized to test these indicated variables on electric generators and other auxiliary power units. As such, the general purpose of the present invention, which will be described subsequently in greater detail, is to provide a new and improved RPM and voltage testing instrument which has all the advantages of the prior art testing instruments and none of the disadvantages.

To attain this, the present invention essentially comprises an instrument designed to check the operating speed (RPM) and voltage output of a generator set. The device is intended to be used to verify the proper operation of a generator set (or any auxiliary power unit such as a DC to AC invertor) and as a tool to make necessary adjustments to the governor or frequency control of any such device.

As the armature of a generator set turns, it produces a voltage and a frequency of alternating current. This frequency and voltage is predetermined by the designer and manufacturer of the generator set. Most of the U.S. made sets are 120 volt, 60 hertz (Hz). The speed (RPM) of the engine directly controls the frequency output of the generator. In the design of the generator, the engine may turn at any given RPM depending on the armature design, the stator design or belt or gear reduction arrangement. Most U.S. made sets run at 1800 RPM, 2700 RPM, or 3600 RPM. Regardless of the RPM at which the engine is turning, if it is at the correct speed set by the manufacturer, it will produce 60 Hz.

The test instrument comprising the present invention simply plugs into an outlet powered by the generator set since it is totally self-contained and uses power from a 110/120 volt outlet mounted on the set per se. Electrical loads can be added to and removed from the generator set while the test instrument monitors the voltage and frequency, and necessary adjustments to the governor of the generator set can be made to maintain the 120 volt, 60 Hz output. Use of the instrument permits a consumer to know in advance of a low voltage, high voltage, overload, low frequency or high frequency problem before damage can be caused to equipment which will eventually be powered by either the generator set or the auxiliary power supply. The advantages of the instrument are the simple operation (no rewiring or positioning of test leads into a hot socket), self-contained (no batteries or add-ons), and the use of two meters in one (giving the consumer the complete information needed).

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new and improved RPM and voltage test instrument which has all the advantages of the prior art RPM and voltage test instruments and none of the disadvantages.

It is another object of the present invention to provide a new and improved RPM and voltage test instrument which may be easily and efficiently manufactured and marketed.

It is a further object of the present invention to provide a new and improved RPM and voltage test instrument which is of a durable and reliable construction.

An even further object of the present invention is to provide a new and improved RPM and voltage test instrument which is susceptible of a low cost of manufacture with regard to both materials and labor, and which accordingly is then susceptible of low prices of sale to the consuming public, thereby making such RPM and voltage test instruments economically available to the buying public.

Still yet another object of the present invention is to provide a new and improved RPM and voltage test instrument which provides in the apparatuses and methods of the prior art some of the advantages thereof, while simultaneously overcoming some of the disadvantages normally associated therewith.

Still another object of the present invention is to provide a new and improved RPM and voltage test instrument which will count the frequency change in the AC output of a generator set.

Yet another object of the present invention is to provide a new and improved RPM and voltage test instrument which will measure the voltage output in the AC output of a generator set.

Even still another object of the present invention is to provide a new and improved RPM and voltage test instrument wherein the same is self-contained and plugs directly into a 120 volt, 15 amp outlet powered by a generator set, and wherein such instrument utilizes electricity from that outlet to power the internal circuitry associated therewith, as well as to make frequency and voltage measurements from the same source of power.

Even yet another object of the present invention is to provide a new and improved RPM and voltage test instrument utilizable with a generator set wherein operating loads can be turned on and off while the invention is on so that necessary adjustments to governor sensitivity and speed control can be made to maintain a desired 120 volt, 60 Hz output.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
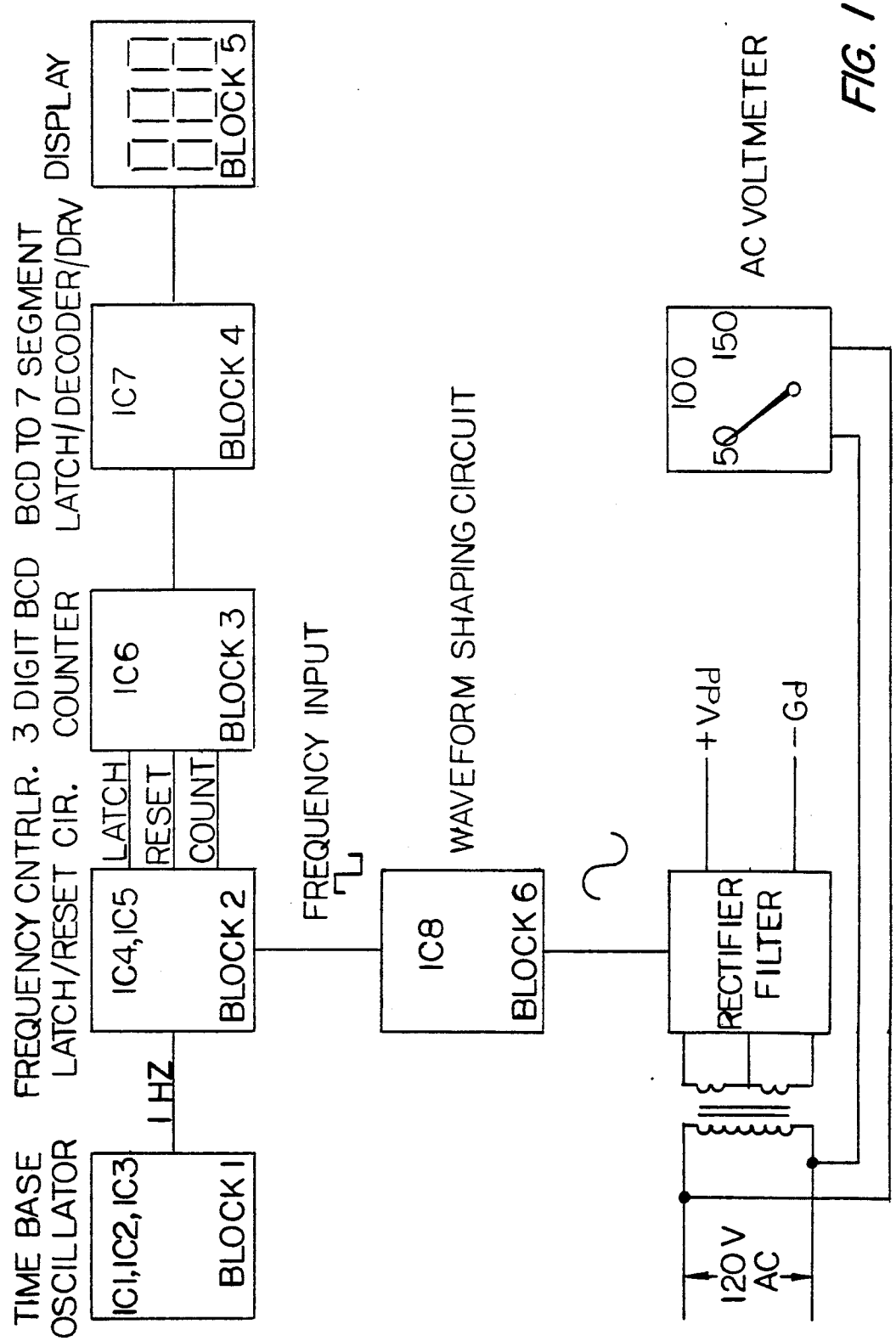
FIG. 1 is a block diagram showing an embodiment of the frequency counter and voltmeter according according to the present invention.

With reference now to the drawings, and in particular to FIG. 1 thereof, a new and improved RPM and voltage indicator for an electric generator embodying the principles and concepts of the present invention and generally designated by the reference numeral 10 will be described.

More specifically, it will be noted that FIG. 1 is a block diagram showing an embodiment of the frequency counter and voltmeter forming the fundamental structure of the present invention. In this regard, a time base oscillator circuit 12 is shown in block 1 and is utilized to establish a time base having an output of 1 Hz. A latch/reset circuit 14 in block 2 of the diagram is triggered by the one Hz input thereto.

During the first cycle, the frequency from the frequency input is passed to a 3 digit BCD counter 16 as illustrated by block three, and at the end of the cycle, the frequency input is blocked. A three digit BCD latch/decoder/driver 18, as illustrated by block 4, takes the total counted frequency that is stored in the three digit BCD counter 16 and displays it on a display 20 as illustrated in block 5.

During the second cycle, the latch/reset circuit 14 continues to block the frequency input and resets the three digit BCD counter 16 to "000". The latch/reset circuit 14 returns to the first cycle and the process repeats itself. A transformer 22 having a rectifier and filter is used in FIG. 1 to supply the necessary DC voltage to power the circuits of the frequency counter. A waveform shaping circuit 24 is tapped into the low side of the transformer 22 to supply the frequency for the frequency input. The waveform shaping circuit 24 receives a sine wave 26 from the transformer 22 and changes it to a square wave 28 which is necessary for the frequency counter. A voltmeter 30 is tapped into the primary windings of the transformer 22 to give a continuous reading of the input voltage which is the output voltage of the generator set.

Figure 2:
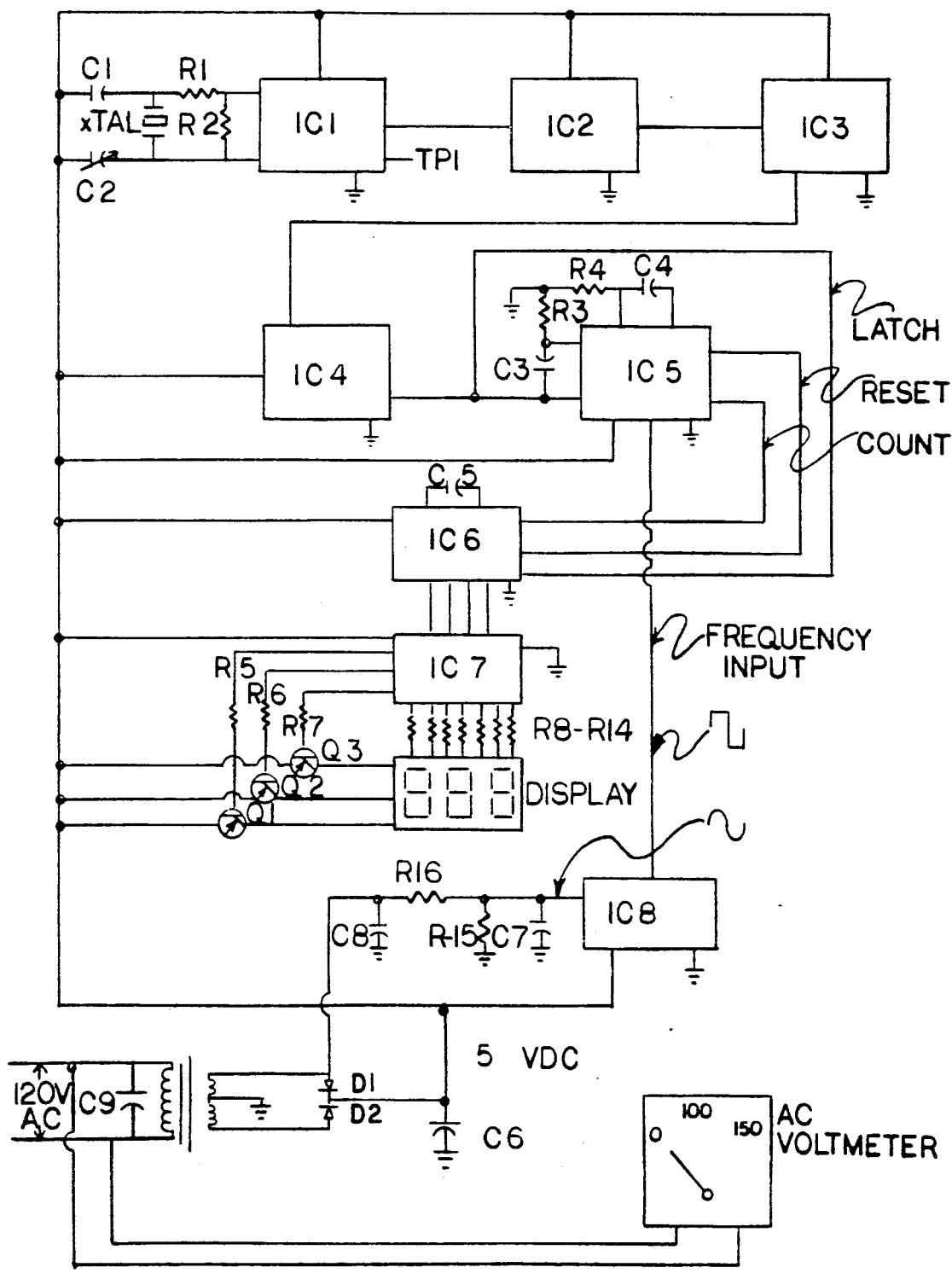
FIG. 2 is a schematic of the electrical circuitry of the invention.

FIG. 2 of the drawings illustrates an electrical schematic of the invention wherein such schematic is generally referenced by the numeral 32. Capacitors C1 and C2, resistors R1 and R2, and crystal XTAL comprise an oscillator which produces 3,579,545 Hz. C2 is a tunable capacitor. Test point TP1 on integrated circuit IC1 represents a test point where a frequency meter can be connected to adjust capacitor C2, and C2 should be adjusted so the oscillator produces the aforementioned 3,579,545 Hz. IC1 receives the 3,579,545 Hz input and divides it to produce a 60 Hz square wave output. Integrated circuit IC2 receives the 60 Hz input and divides it to produce a 10 Hz square wave output. Integrated circuit IC3 receives the 10 Hz input and divides it to produce a 1 Hz square wave output.

Integrated circuit IC4 receives the 1 Hz input and divides it by two to provide the two cycles necessary to operate the latch/reset circuit 14, as illustrated in FIG. 1, and capacitors C3, C4 and resistors R3, R4 comprise a circuit to provide proper timing for the reset output of integrated circuit IC5. IC5 receives the two cycles from IC4 and receives the frequency input from integrated circuit IC8 to properly time the reset and count output to integrated circuit IC6.

IC6 receives the trigger inputs (latch/reset/count) and its purpose is to count the frequency for the time duration of 1 Hz and then send the information to the integrated circuit IC7. IC7 is a decoder/driver, and it receives the BCD code from IC6 and converts it to drive the 7 segment display board.

The three digits in the display board 20 are turned on one at a time in rapid secession, giving the illusion that they are all on at once. Q1, Q2 and Q3 are the transistors used to turn on each digit. Resistors R5, R6 and R7 are used to bias the transistors, and IC6 controls these transistors. When IC6 sends a BCD code to IC7, it turns on the appropriate digit. IC6 turns off that digit, sends a new code and turns on the next digit. It then turns off that digit, sends a new code and turns on the next digit, and this repeats itself in rapid succession. Capacitor C5 controls the digit select oscillator, and resistors R8–R14 all control the current through the display board.

Integrated circuit IC8 is a waveform shaping circuit as denoted by block 24 in FIG. 1. The input from the transformer 22 is a sine wave 26 which is converted to a square wave output 28 and which is then sent to IC5. Resistors R15 and R16 control the voltage of the sine wave input to IC8. Capacitors C7 and C8 filter electrical noise which may cause false triggering of IC8.

The input to transformer TR1 (numeral 22 in FIG. 1) comes from a 120 volt, 15 amp plug which is plugged into an outlet powered by the generator set or power invertor. The voltmeter is tapped onto the primary windings of the transformer 24, and capacitor C9 operates as a filter for the 120 volt AC input. The secondary windings of the transformer 24 are center tapped to ground, and the output voltages are rectified by diodes D1 and D2. The DC voltage is filtered by capacitor C6, and this provides the voltage necessary to power the frequency counter circuits.

Figure 3:
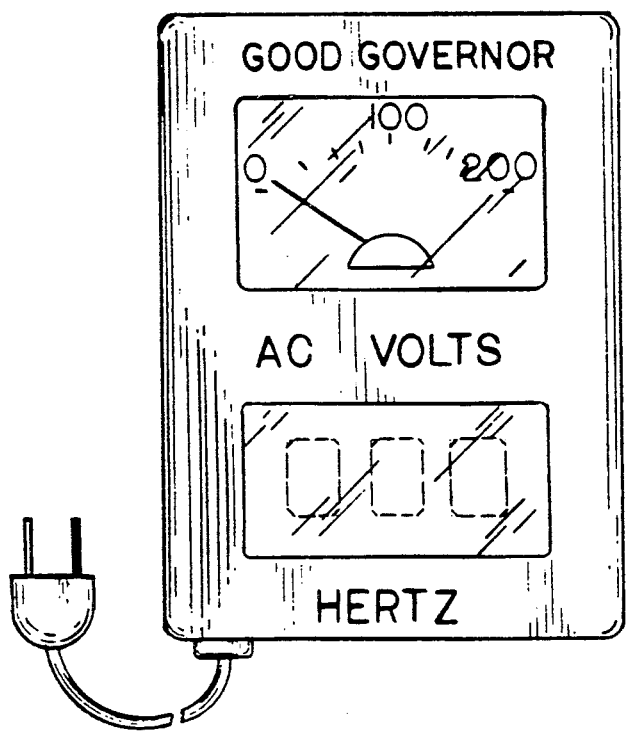
FIG. 3 is an elevation view of the instrument comprising the present invention wherein the same is illustrated as being of a portable construction designed to plug into a 120 volt, 15 amp outlet.
Figure 4:
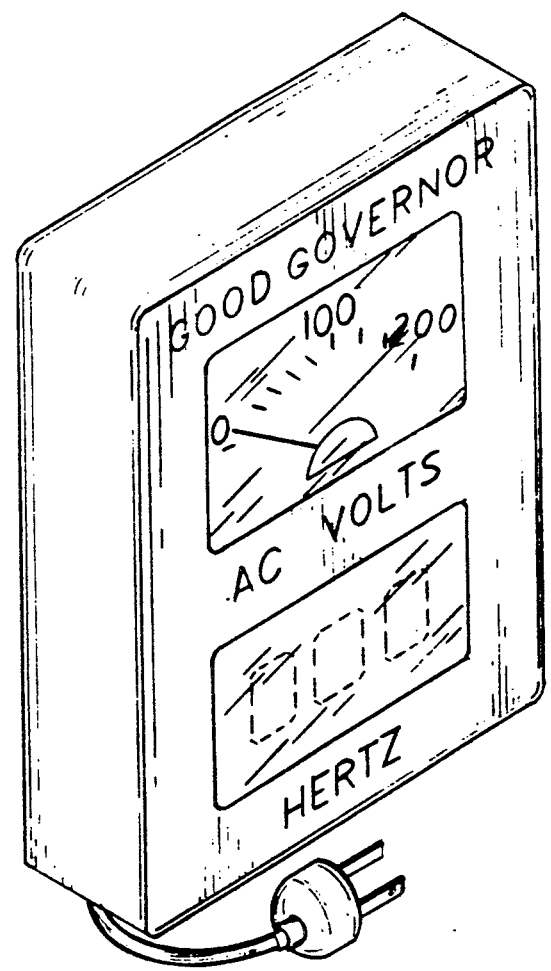
FIG. 4 is a perspective view of the instrument illustrated in FIG. 3.

As shown in FIGS. 3 and 4, and appropriate housing 40 can be used to house the operative circuitry of FIG. 2, and all such conceivable housing designs are within the intent and purview of the present invention.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed as being new and desired to be protected by Letters Patent of the United States is as follows:

1. An RPM and voltage indicator for an electrical generator comprising:
   time base means for establishing a time base for said indicator, said time base means being utilized to establish a time base set at one hertz;
   latch/reset means triggered by an output of said time base means;
   counter means for measuring a frequency from an output of said latch/reset means, said counter means comprising a three digit BCD counter;
   latch/decoder/driver means for receiving an output from said counter means;
   display means for displaying a frequency received from an output of said latch/decoder/driver means;
   power supply means which includes a transformer having a rectifier and filter, said transformer supplying a necessary direct current voltage to power said indicator;
   a wavefore shaping circuit tapped into said transformer to supply said frequency for a frequency input;
   a voltmeter tapped into primary windings of said transformer so as to provide a continuous reading of an input voltage which is an output voltage of said generator.

* * * * *